United States Patent
Takano et al.

(10) Patent No.: US 6,279,021 B1
(45) Date of Patent: Aug. 21, 2001

(54) DIGITAL FILTERS (75) Inventors: Koji Takano, Ogaki; Fumiaki Nagao, Ibi-gun, both of (JP)

(73) Assignee: Sanyo Electric Co. Ltd. (JP)

( * ) Notice: Subject to any disclaimer, the term of this patent is extended or adjusted under 35 U.S.C. 154(b) by 0 days.

(21) Appl. No.: 09/237,837

(22) Filed: Jan. 26, 1999

(30) Foreign Application Priority Data

Jan. 30, 1998 (JP) .................................................. 10-019405

(51) Int. Cl.$^7$ ..................................................... G06F 17/10
(52) U.S. Cl. ........................... 708/319; 708/320; 708/316
(58) Field of Search .................................. 708/303, 316, 708/319–320

(56) References Cited

U.S. PATENT DOCUMENTS

| | | | |
|---|---|---|---|
| 5,319,584 | * 6/1994 | Ooyabu | 708/316 |
| 5,438,532 | 8/1995 | Nagao et al. | 364/724.16 |
| 5,904,731 | * 5/1999 | Matsui | 708/319 |

FOREIGN PATENT DOCUMENTS

| | | |
|---|---|---|
| 6-216715 | 8/1994 | (JP) . |
| 6-216716 | 8/1994 | (JP) . |
| 7-131295 | 5/1995 | (JP) . |

OTHER PUBLICATIONS

Claude R. Garland and Henri J. Nussbaumer. "New Quadrature Mirror Filter Structures." *IEEE Transactions on Acoustics, Speech, and Signal Processing* vol. ASSP–32, No. 3, Jun. 1984, pp. 522–531.

* cited by examiner

Primary Examiner—Tan V. Mai
(74) Attorney, Agent, or Firm—Cantor Colburn LLP (57) ABSTRACT A digital filter is provided with a plurality of selectors. Switchover from one selector to another switches the digital filter operation between its separation filter function and synthesis filter function. The digital filter is constructed mainly with a multiplier, an accumulator, and an adder-subtracter which are commonly used to implement both separation and synthesis filters. When the digital filter functions as the separation filter, the input data is output as is to the external by selector switchover.

6 Claims, 8 Drawing Sheets

| | | | |
|---|---|---|---|
| INPUT DATA | X(8) | X(9) | X(10) |
| RAM WRITE | X(8) | | X(9) |
| RAM READ | X(8) | X(6) | X(4) | X(2) | X(7) | X(5) | X(3) | X(1) |
| ROM READ | 1 | h(0) | h(2) | h(4) | h(6) | h(1) | h(3) | h(5) | h(7) |
| REGISTER | | A(1) | A(2) | A(3) | A(4) | B(1) | B(2) | B(3) | B(4) |
| FIRST REGISTER | | | | | A(4) | | | | |
| SECOND REGISTER | | | | | | | | | B(4) |
| FIRST OUTPUT REGISTER (OUTPUT DATA) | | | | | | | | | Yb(4) | Ya(4) |
| SECOND OUTPUT REGISTER (INPUT DATA) | | | | | | X(8) | | | |

Fig. 6

| | | | | | | | | | | | |
|---|---|---|---|---|---|---|---|---|---|---|---|
| INPUT DATA | | Xb(4) | | | Xa(5) | | | Xb(5) | | | |
| FIRST REGISTER | | | Xa(4) | | | | Xa(5) | | | | |
| SECOND REGISTER | | | | Xb(4) | | | | | Xb(5) | | |
| RAM WRITE | Xa(4)-Xb(4) | | | | | Xa(4)+Xb(4) | | Xa(5)-Xb(5) | | | |
| RAM READ | | Xa(4)-Xb(4) | Xa(3)-Xb(3) | Xa(2)-Xb(2) | Xa(1)-Xb(1) | | Xa(4)-Xb(4) | Xa(3)-Xb(3) | Xa(2)-Xb(2) | Xa(1)-Xb(1) | |
| ROM READ | h(0) | h(2) | h(4) | h(6) | h(1) | h(3) | h(5) | h(7) | | | |
| REGISTER | | A(1) | A(2) | A(3) | A(4) | B(1) | B(2) | B(3) | B(4) | | |
| SECOND OUTPUT REGISTER (OUTPUT DATA) | Y(7) | | | | Y(8) | | | | Y(9) | | |

DIGITAL FILTERS

BACKGROUND OF THE INVENTION

1. Field of the Invention

The present invention relates to digital filters that are used for digital audio devices in order to execute digital data separation and/or synthesis.

2. Description of the Related Art

A Finite Impulse Response (FIR) type digital filter is constructed so that output data Y(n) will be produced by convoluting input data X(n) and impulse responses, as expressed by equation (1).

$$Y(n) = \sum_{k=0}^{N-1} h(k) \cdot X(n-k) \tag{1}$$

where, h(k) is a filter coefficient and N is the number of taps. When transformed with regard to Z, the equation (1) will be as follows:

$$H(z) = \sum_{n=0}^{N-1} h(n) \cdot Z^{-n} \tag{2}$$

The equation (2) will be further transformed as follows:

$$H(e^{j\omega}) = \sum_{n=0}^{N-1} h(n) \cdot e^{-j\omega n} \tag{3}$$

The equation (3) determines a frequency response. Assuming that $\omega = 2\pi k/N$, the equation (3) will be as follows:

$$H(e^{j\omega}) - \sum_{n=0}^{N-1} h(n) \cdot e^{-j2\pi nk/N} \tag{4}$$

This equation (4) may be regarded as an expression of Discrete Fourier Transformation (DFT). Thus, the filter coefficient h(k) is obtained through Inverse Discrete Fourier Transformation (IDFT) of the frequency characteristic given by the equation 4.

Figure 1:
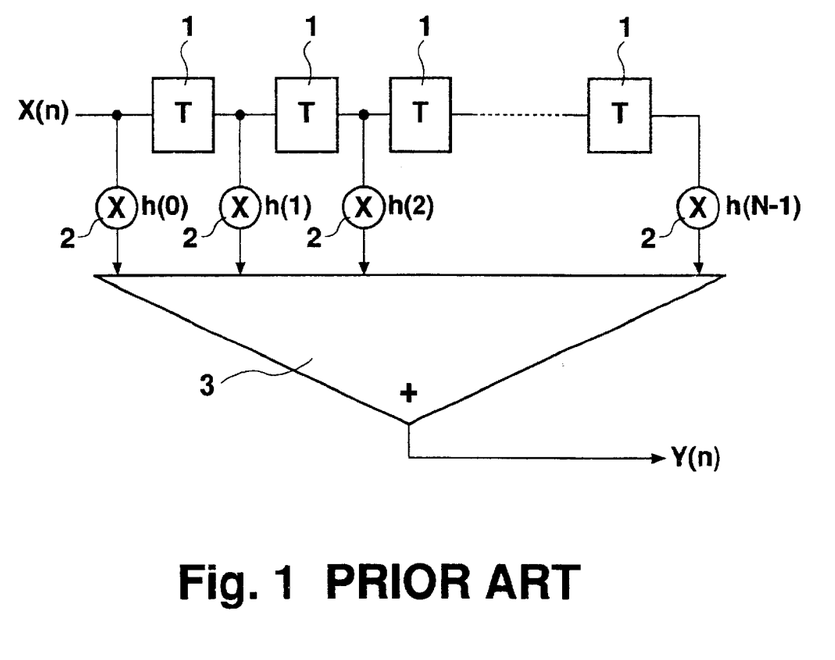
FIG. 1 is a circuit diagram showing the structure of a predecessor FIR digital filter.

FIG. 1 shows the circuit of a standard FIR type digital filter.

In this filter circuit, a plurality of delay elements 1, which may be, for example, shift registers, are connected in series with each other and each of these elements delays the input data X(n) a certain period T. This circuit also has a plurality of multipliers 2, the first multiplier connected to the input data X(n) carrying line to the first delay element 1 and the remaining connected to the output line from each delay element 1. The first multiplier 2 multiplies the input data X(n) by a given filter coefficient h(k) and the remaining multipliers 2 multiply the output from each delay element 1 by the same filter coefficient h(k). In this way, the input data X(n) is convoluted with the impulse responses.

A total sum adder 3, included in this circuit, sums up the outputs from all the multipliers 2, that is, the input data X(n) and the outputs from all delay elements 1 after being multiplied by the predetermined filter coefficient h(k), and produces output data Y(n). Consequently, the input data X(n) has now been processed, subject to the arithmetic operation in compliance with the above-mentioned equation (1).

Because an array of delay elements 1 and multipliers 2, corresponding to the number of taps N are required, this type of digital filter has a problem that its entire circuit size becomes larger as the number of the taps increases. Therefore, a digital filter using a stored program method has been proposed which stores time-series input data in a memory once and sequentially multiplies the input data by the filter coefficient after reading it from the memory, while accumulating the product of each multiplication.

Figure 2:
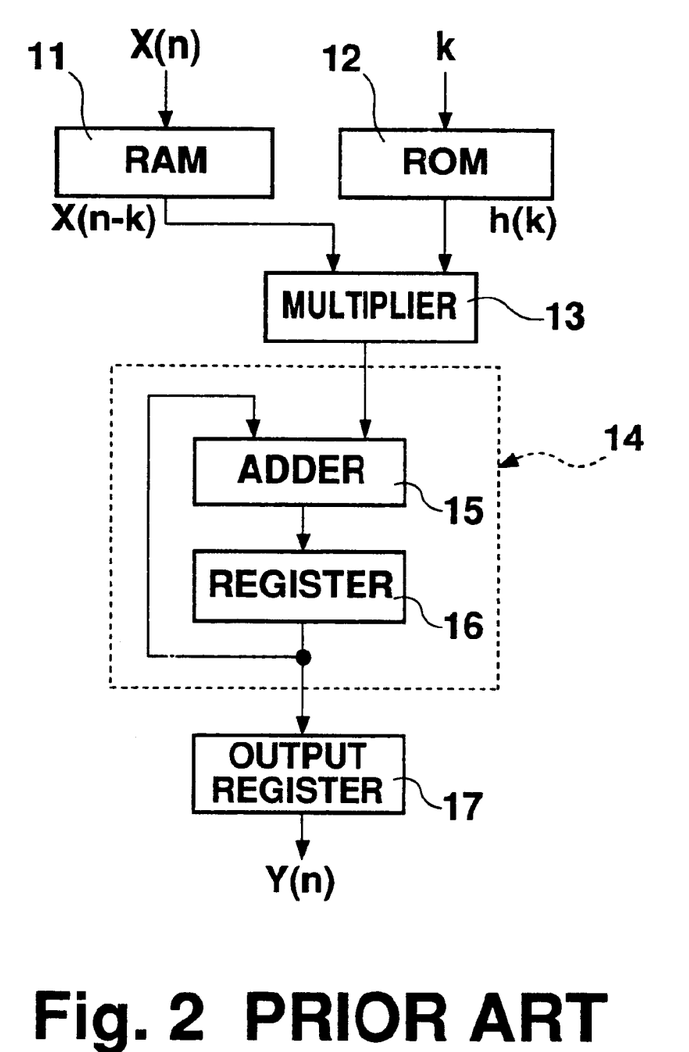
FIG. 2 is a block diagram showing the structure of a predecessor digital filter based on the stored program method.

FIG. 2 shows a block diagram representing the digital filter using the stored program method.

In this block diagram, a RAM 11 sequentially stores time-series input data X(n) that has been input to it from moment to moment. A plurality of filter coefficients h(k) are stored in a ROM 12. Input data X(n) stored in the RAM 11 is read out at its arithmetic step and from the ROM 12 a step-specific filter coefficient h(k) with a value of k incrementing step by step is read out, where k corresponds to the k described in equation (1). Then, a multiplier 13 multiplies the input data X(n-k) read from the RAM 11 by the filter coefficient h(k) read from the ROM 12.

An accumulator 14, consisting of an adder 15 and a register 16, accumulates the product of each multiplication executed by the multiplier 13. Specifically, the adder 15 adds the output from the multiplier 13 and the output from the register 16 and the resultant sum is stored into the register 16 again. In this way, the product of each multiplication executed by the multiplier 13 is heated up sequentially. An output register 17 receives an accumulation value output from the accumulator 14 and outputs it as output data Y(n).

After reading the input data X(n) and the filter coefficient h(k) sequentially from the RAM 11 and ROM 12, respectively, the FIR type digital filter repeats the product sum arithmetic operation and produces the output data Y(n), thus processing the arithmetic of equation (1). This type of a digital filter does not become large, even if the filter circuit includes a large number of taps N.

One digital filter is assumed to have the first filter coefficient h1(n), whereas another digital filter is assumed to have the second filter coefficient h2(n) given by the following equation:

$$h_2(n) = (-1)^n \cdot h1(n) \tag{5}$$

The latter digital filter is referred to as a mirror filter because of its frequency response characteristics. The arithmetic relation of this filter with Z transformation can be expressed as follows:

$$\begin{aligned} H_2(z) &= \sum_{n=-\infty}^{\infty} Z^{-n} \cdot h_2(n) \\ &= \sum_{n=-\infty}^{\infty} Z^{-n} \cdot (-1)^{-n} \cdot h_1(n) \\ &= H_1(-Z) \end{aligned} \tag{6}$$

When we consider the frequency response characteristics of the filter, the following equation is obtained:

$$h_2(n) = e^{j\pi n} \cdot h_1(n) \tag{7}$$

When equation (7) is assigned to equation (6), the following equation is derived:

$$H_2(e^{j\omega}) = H_1(e^{j\omega + j\pi}) \tag{8}$$

From equation (8), the frequency response characteristics of the mirror filter are symmetric with regard to $\pi/2$. Because π/2 is ¼ of the sampling period, the mirror filter is called a Quadrature Mirror Filter (QMF). A QMF of this kind is detailed in a publication "IEEE Transactions on Acoustics Speech and Signal Processing" (Vol. ASSP-32, No. 3, Jun., 1984, pp. 522–531).

A separation filter in which the above-mentioned QMF separates the input data into frequency components in different bands is constructed to produce two output data Ya(n) and Yb(n) which have been separated from the input data X(n). This filter convolutes the input data X(n) with the impulse responses and executes adding and subtracting calculations on the data obtained from the convolution process, as expressed by equations (9) and (10).

$$Ya(n) = \sum_{k=N-1}^{0} h(2k) \cdot X(2n - 2k) - \sum_{k=N-1}^{0} h(2k+1) \cdot X(2n - 2k + 1) \tag{9}$$

$$Yb(n) = \sum_{k=N-1}^{0} h(2k) \cdot X(2n - 2k) + \sum_{k=N-1}^{0} h(2k+1) \cdot X(2n - 2k + 1) \tag{10}$$

Figure 3:
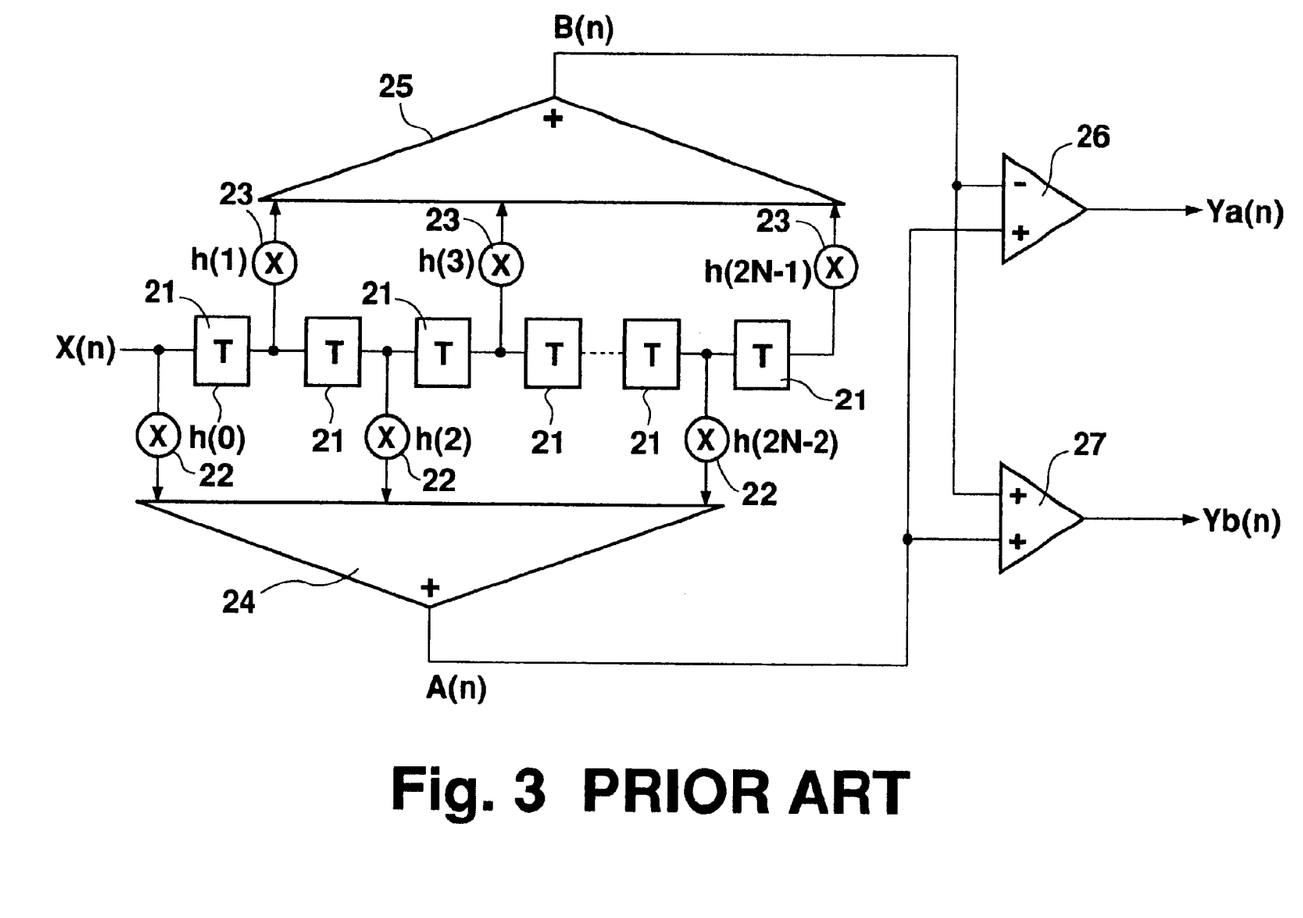
FIG. 3 is a circuit diagram showing the structure of a separation filter using a predecessor QMF.

FIG. 3 shows a block diagram representing the structure of the separation filter in which data separation into different frequency bands is performed according to equations (9) and (10).

As shown in this block diagram, a plurality of delay elements 21 are serially connected and each of these elements delays the input data X(n) a certain period T. Of a plurality of first multipliers 22, one is connected to the input data X(n) carrying line to the first delay element 21 and the remaining multipliers 22 are connected to the output line from each of the delay elements 21 located in the even number stages. The first multipliers 22 multiply the input data X(n) and the outputs from these delay elements 21 by a filter coefficient h(2k). There are also a plurality of second multipliers 23 connected to the output line from each of the delay elements 21 located in the odd number stages. The second multipliers 23 multiply the outputs of these delay elements 21 by a filter coefficient h(2k+1). In this way, the input data X(n) is convoluted with the impulse responses.

A first total sum adder 24 sums up the outputs from all first multipliers 22 and outputs intermediate data An. On the other hand, a second total sum adder 25 sums up the outputs from all second multipliers 23 and outputs intermediate data Bn.

A subtracter 26 subtracts the intermediate data Bn supplied by the second total sum adder 25 from the intermediate data An supplied by the first total sum adder 24, and outputs the first output data Ya(n). An adder 27 adds the intermediate data An supplied by the first total sum adder 24 and the intermediate data Bn supplied by the second total sum adder 25 and outputs the second output data Yb(n). In this way, the filter circuit accomplishes the arithmetic operation in compliance with the equations (9) and (10).

On the other hand, a synthesis filter in which the above-mentioned QMF synthesizes the input data frequency components existing in separate bands is constructed to produce an output data Y(n) into which the input data Xa(n) and Xb(n) are combined. This filter convolutes the values obtained by adding and subtracting calculations on the first and the second input data Xa(n) and Xb(n) with the impulse responses, as expressed by equations (11) and (12).

$$Y(2n) = \sum_{k=0}^{N-1} h(2k)\{Xa(n-k) - Xb(n-k)\} \tag{11}$$

$$Y(2n+1) = \sum_{k=0}^{N-1} h(2k+1)\{Xa(n-k) + Xb(n-k)\} \tag{12}$$

Figure 4:
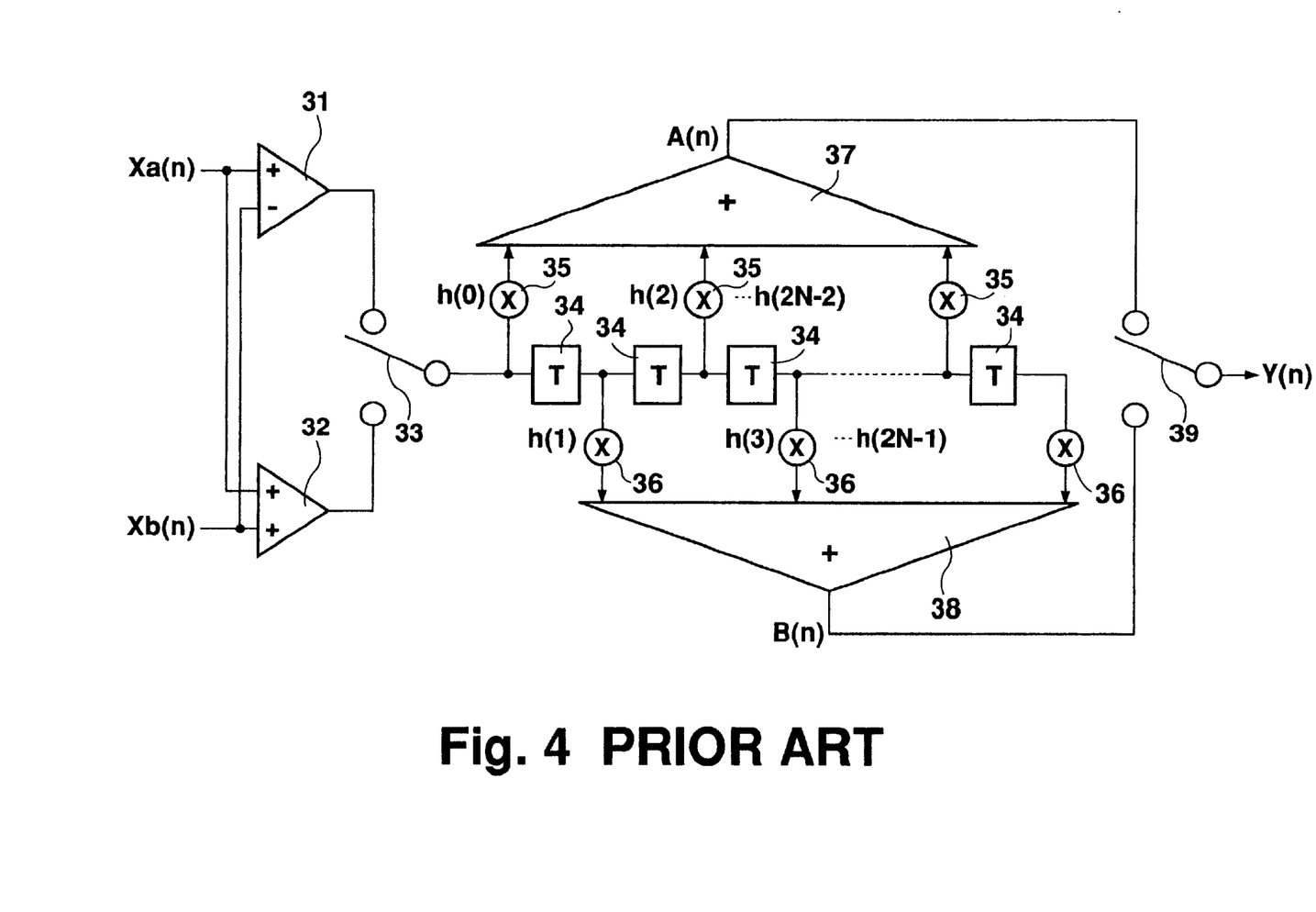
FIG. 4 is a circuit diagram showing the structure of a synthesis filter using a predecessor QMF.

FIG. 4 shows a block diagram representing the structure of the synthesis filter in which the synthesis of separate frequency bands is performed in accordance with the equations (11) and (12).

As shown in this block diagram, a subtracter 31 subtracts the second input data Xb(n) from the first input data Xa (n) and an adder 32 adds the first and the second input data Xa(n) and Xb(n). A changeover switch 33 alternately switches the output between the output from the subtracter 31 and the output from the adder 32.

A plurality of delay elements 34 are serially connected and each of these elements delays the output from the subtracter 31 or the output from the adder 32 a certain period T. Of a plurality of first multipliers 35, one multiplier 35 is connected to the output line from the switch 33 and the remaining are connected to the output line from each of the delay elements 34 located in the even number stages. The first multipliers 35 multiply the switch 33 output and the outputs from these delay elements 35 by a filter coefficient h(2k). Also included are a plurality of second multipliers 36 connected to the output line from each of the delay elements 34 located in the odd number stages. The second multipliers 36 multiply the outputs of these delay elements 34 by a filter coefficient h(2k+1). The main filter circuit section described above allows the values obtained by adding and subtracting calculations on the first and the second input data Xa(n) and Xb(n) to be convoluted with the impulse responses.

A first total sum adder 37 sums up the outputs from all first multipliers 35 and outputs intermediate data An. On the other hand, a second total sum adder 38 sums up the outputs from all second multipliers 36 and outputs intermediate data Bn. A changeover switch 39 alternately switches between the intermediate data An and the intermediate data Bn in synchronization with the changeover switch 33 and outputs the output data Y(n). In this way, the filter circuit accomplishes the arithmetic operation in compliance with equations (11) and (12).

The Applicant previously proposed constructing the separation and synthesis filters described above by using the above-mentioned stored program method. The details of this proposal are disclosed in Japanese Patent Laid-Open Publications No. Hei 6-216715 and No. Hei 7-131295.

For audio devices such as mini-disc (MD) players, data separation is executed when recording sound in order to separate audio data consisting of mixed different frequency components into data components in their specific frequency bands. Also, data synthesis is executed when reproducing sound in order to return a plurality of data to read which have been recorded in their specific frequency bands to the original form of the audio data. Therefore, such device is designed to operate as follows. In sound recording mode, using a separation filter as shown in FIG. 3, the device separates the audio data into data components in their specific frequency bands and compresses each separated data before recording the data into a recording medium. In sound reproducing mode, using a synthesis filter as shown in FIG. 4, the device synthesizes a plurality of data to read which has been expanded after read from the recording medium and produces the output.

Such a device enabling both sound recording and reproduction is required to have both separation and synthesis filters, which creates a problem that circuit size is made larger. Even if the QMF based on the above-mentioned stored program method is used, two sets of multipliers and accumulators are required and it is difficult to reduce the overall circuit size.

SUMMARY OF THE INVENTION

An object of the present invention is to provide a digital filter that is capable of executing data separation and synthesis.

The digital filter according to the present invention, when its first selector selects the sum of accumulation executed by an accumulator and its second selector selects time-series input data, executes multiplication and accumulation processing on the time-series input data and then executes adding and subtracting calculations on the prior arithmetic result. When the first selector selects time-series input data and the second selector selects the result of arithmetic executed by an adder-subtracter, the digital filter executes adding and subtracting calculations on a plurality of time-series input data and then executes multiplication and accumulation processing on the prior arithmetic result. A separation filter is implemented by carrying out adding and subtracting calculations after multiplication and accumulation. A synthesis filter is implemented by carrying out multiplication and accumulation after adding and subtracting calculations.

When data separation is executed, the data produced by the arithmetic executed by the adder-subtracter 50 becomes an encode output and one output from the multiplier 43 becomes a monitor output.

DESCRIPTION OF PREFERRED EMBODIMENTS

[First Embodiment]

Figure 5:
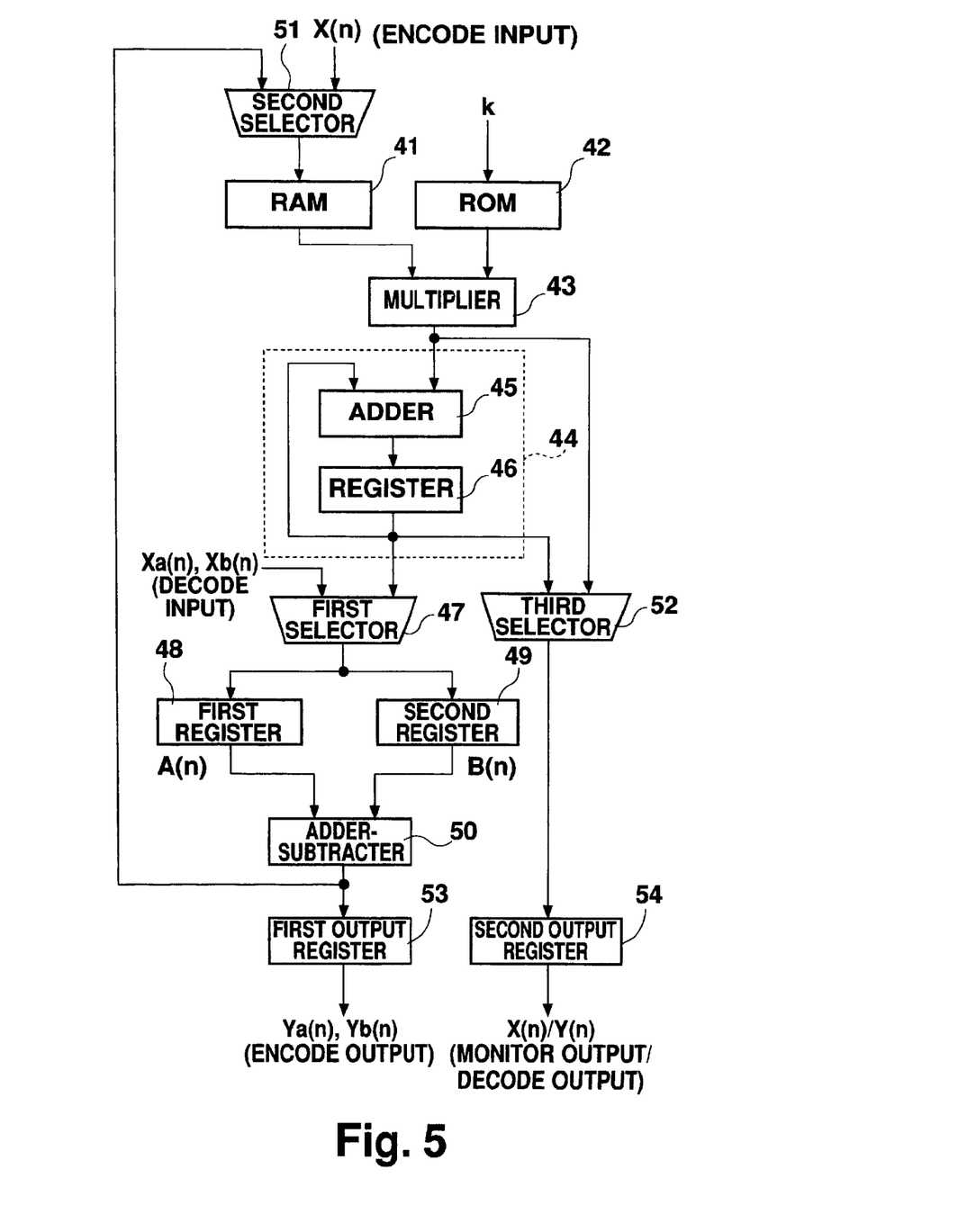
FIG. 5 is a block diagram showing a digital filter configured as in a first embodiment of the present invention.

FIG. 5 is a block diagram showing a digital filter configured according to a first embodiment of the present invention.

RAM 41, connected to a second selector 51 which will be described below, stores time-series data which has been input to it from the second selector 51 for a predetermined period. Each data stored in the RAM 41 is sequentially read out for the arithmetic processing step. From a ROM 42, in which a constant of "1" and a plurality of filter coefficients h(k) have previously been stored, reads a constant of "1" at predetermined timing and a step-specific filter coefficient h(k) with a value of k incrementing step by step is read out repeatedly, where k corresponds to the k given in the above-mentioned equations (9) through (12). A multiplier 43, connected to the RAM 41 and the ROM 42, multiplies a constant of "1" or the data read from the RAM 41 by the filter coefficient h(k) read from the ROM 42. An accumulator 44 consisting of an adder 45 and a register 46 is connected to the multiplier 43. The accumulator 44 accumulates the product of each multiplication executed by the multiplier 43 in accordance with the number of taps. To be exact, the adder 45 adds the data read from the register 46 and the multiplication product data supplied from the multiplier 43 and the resultant sum is stored into the register 46 again. In this way, the product of each multiplication executed by the multiplier 43 is accumulated.

A first selector 47, connected to the accumulator 44 and the decode input, selects and outputs either (i) the accumulation data supplied from the accumulator 44 or (ii) time-series input data Xa(n) and Xb(n). From the decode input, one of the two input data Xa(n) and Xb(n) is alternately input to the first selector 47 on a time-sharing basis. A first register 48 and a second register 49 are connected to the first selector 47. These registers 48 and 49 alternately receive and store the data which is continuously supplied from the first selector 47, so that either (i) the accumulation data or (ii) the input data Xa(n) and Xb(n) will be written into one of the registers. Then, the registers 48 and 49 output the stored data at a given timing, respectively. For example, these registers are designed such that data A(n) which is output from the first selector 47 at the first and at following odd number inputs will be stored into the first register 48 and data B(n) which is output from the first selector 47 at the second and following even steps will be stored into the second register 49. An adder-subtracter 50, connected to the first register 48 and the second register 49, executes subtracting or adding calculation on the data A(n) and B(n) read from the registers 48 and 49. A second selector 51, connected to the adder-subtracter 50 and the encode input, selects and outputs either the adding/subtracting calculation data supplied from the adder-subtracter 50 or time-series input data X(n) supplied from the encode input.

A third selector 52, connected to the multiplier 43 and the accumulator 44, selects and outputs either the multiplication product data supplied from the multiplier 43 or the accumulation data supplied from the accumulator 44.

When the digital filter executes the separation of input data X(n), a first output register 53, connected to the adder-subtracter 50, stores the adding/subtracting calculation data which has been supplied from the adder-subtracter 50 whenever the adder-subtracter completes arithmetic processing, and outputs data Ya(n) and Yb(n). In response to the adder-subtracter 50 that repeats alternately addition and subtraction, for example, the register 53 outputs the subtracting calculation data as output data Ya(n) and the adding calculation data as output data Yb(n). The output from the first output register 53 becomes an encode output. When the digital filter executes the separation of input data X(n), a second output register 54, connected to the third selector 52, stores the multiplication product data which has been input to it from the multiplier 43 via the third selector 52. Because a multiplier of "1" is predetermined to be supplied from the ROM 42, this multiplication product data is input data X(n) as such. The output from the output register at this moment, that is, the input data X(n) as such becomes a monitor output. A second output register 54, connected to the accumulator 44, stores the accumulation data which has been supplied from the accumulator 44 whenever the accumulator completes required arithmetic processing, and outputs data Y(n). The output from the second output register 54 becomes a decode output.

The digital filter, whose components are outlined above, acts as a separation filter when the first selector 47 selects the accumulation data from the accumulator 44 and the second selector 51 selects input data X(n). The digital filter operating in this mode produces data Ya(n) and Yb(n) from the input data X(n) and outputs data Ya(n) and Yb(n) through the first output register 53 as well as the input data X(n) as such through the second output register 54. This operation method in which the input data X(n) is also output from the second output register 54 can implement a Digital Interface Transfer (DIT) function which allows input audio data to be output as is during sound recording operation. When the first selector 47 selects input data Xa(n) and Xb(n) and the second selector 51 selects the adding/subtracting calculation data supplied from the adder-subtracter 50, the digital filter acts as a synthesis filter and outputs data Y(n) produced from the input data Xa(n) and Xb(n) through the second output register 54. That is, the digital filter executes decoding.

If a constant other than "1" is set and stored in the ROM 42, the monitor output level can be changed. The monitor output can be adjusted to a desired level by configuring the digital filter such that the user can select a constant that will amplify or attenuate the input data X(n) after the input data X(n) is multiplied by the constant.

Figure 6:
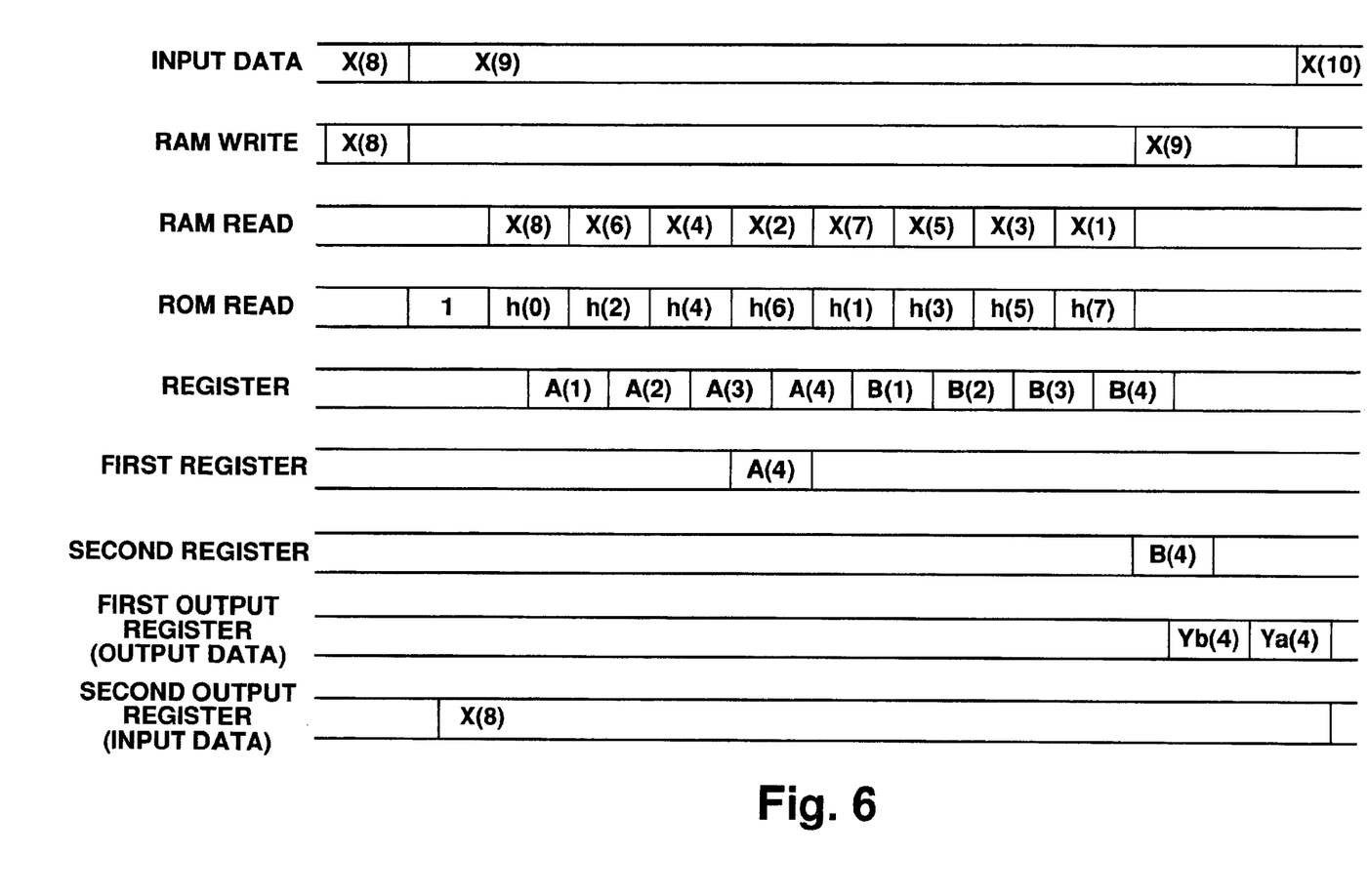
FIG. 6 is an internal data flow timing chart, intended to explain the data separating operation executed by the digital filter of the first embodiment.

FIG. 6 shows an example internal data flow timing chart, in order to explain the separation filter operation of the digital filter configured as shown in FIG. 5, on the assumption that the number of taps N is "4," that is, n=4. In the separation filter mode, the first selector 47 selects the accumulation data from the accumulator 44, the second selector 51 selects input data X(n) and the third selector 52 selects the multiplied data.

If equations (9) and (10) are recalculated assuming the number of taps N=4, the calculation of equation (9) will be as follows:

$$Ya(n)=h(6) \cdot X(2n-6)+h(4) \cdot X(2n-4)+h(2) \cdot X(2n-2)+h(0) \cdot X(2n)- h(7) \cdot X(2n-7)-h(5) \cdot X(2n-5)-h(3) \cdot X(2n-3)-h(1) \cdot X(2n-1) \quad (13)$$

The calculation of equation (10) will be as follows:

$$Yb(n)=h(6) \cdot X(2n-6)+h(4) \cdot X(2n-4)+h(2) \cdot X(2n-2)+h(0) \cdot X(2n)+ h(7) \cdot X(2n-7)+h(5) \cdot X(2n-5)+h(3) \cdot X(2n-3)+h(1) \cdot X(2n-1) \quad (14)$$

Input data X(8) shown in FIG. 6 is written into the RAM 41 via the second selector 51. Although FIG. 6 omits the writing of input data X(0) to X(7), it is assumed that the data X(0) to X(7) have been input prior to the input data X(8) and stored into the RAM 41.

When the input data X(8) is first read from the RAM 41, a constant of "1" is read from the ROM correspondingly, the multiplier 43 multiplies X(8) by "1" and the multiplication product data, that is, the input data X(8) as such is supplied to the second output register 54 via the third selector 52. When a filter coefficient h(0) is then read from the ROM 32, the multiplier 43 multiplies the input data X(8) by h(0) and the multiplication product data is supplied to the accumulator 44. At this time, no data exists in the accumulator 44. Thus, the following value obtained by multiplying the input data X(8) by the filter coefficient h(0) is stored as is into the register 46:

$$A1=h(0) \cdot X(8)$$

Then, the input data X(6), X(4), and X(2) and their corresponding filter coefficients h(2), h(4), and h(6) are sequentially read from the RAM 41 and the ROM 42, respectively. The multiplier 43 multiplies X(6) by h(2), X(4) by h(4), and X(2) by h(6) and sequentially supplies each multiplication product data to the accumulator 44. Each multiplication product input is accumulated in the accumulator 44 and the following are sequentially stored into the register 46:

$$A2=h(2) \cdot X(6)+A1$$

$$A3=h(4) \cdot X(4)+A2$$

$$A4=h(6) \cdot X(2)+A3$$

Eventually, the following data is stored into the register 46:

$$A4=h(0) \cdot X(8)+h(2) \cdot X(6)+h(4) \cdot X(4)+h(6) \cdot X(2)$$

This data is stored into the first register 48 via the first selector 47.

Next, when input data X(7) is read from the RAM 41 and its corresponding filter coefficient h(1) is read from the ROM 42, the multiplier 43 multiplies X(7) by h(1) and the multiplication product data is supplied to the accumulator 44. At this time, the register 46 of the accumulator 44 has been cleared to zero. Thus, the following value obtained by multiplying the input data X(7) by the filter coefficient h(1) is stored as is into the register 46:

$$B1=h(1) \cdot X(7)$$

Then, the input data X(5), X(3), and X(1) and their corresponding filter coefficients h(3), h(5), and h(7) are sequentially read from the RAM 41 and the ROM 42 respectively. Each product obtained by multiplying X(5) by h(3), X(3) by h(5), and X(1) by h(7) is sequentially supplied to the accumulator 44. Thus, the following are sequentially stored into the register 46:

$$B2=h(3) \cdot X(5)+B1$$

$$B3=h(5) \cdot X(3)+B2$$

$$B4=h(7) \cdot X(1)+B3$$

Eventually, the following data is stored into the register 46:

$$B4=h(1) \cdot X(7)+h(3) \cdot X(5)+h(5) \cdot X(3)+h(7) \cdot X(1)$$

This data is stored into the second register 49 via the first selector 47.

From the first register 48 and the second register 49, respectively, the data A4 and B4 are input to the adder-subtracter 50 where A4 and B4 are added and B4 is subtracted from A4. After processed through the adder-subtracter 50, the adding calculation data:

$$A4+B4=h(6) \cdot X(2)+h(4) \cdot X(4)+h(2) \cdot X(6)+h(0) \cdot X(8)+h(7) \cdot X(1)+ h(5) \cdot X(3)+h(3) \cdot X(5)+h(1) \cdot X(7)$$

is stored into the first output register 51 as output data Yb(4). Also, the subtracting calculation data:

$$A4-B4=h(6) \cdot X(2)+h(4) \cdot X(4)+h(2) \cdot X(6)+h(0) \cdot X(8)-h(7) \cdot X(1)- h(5) \cdot X(3)-h(3) \cdot X(5)-h(1) \cdot X(7)$$

is stored into the first output register 53 as output data Ya(4). As a result, the arithmetic operations expressed by the above-mentioned equations (13) and (14) have now been accomplished.

Figure 7:
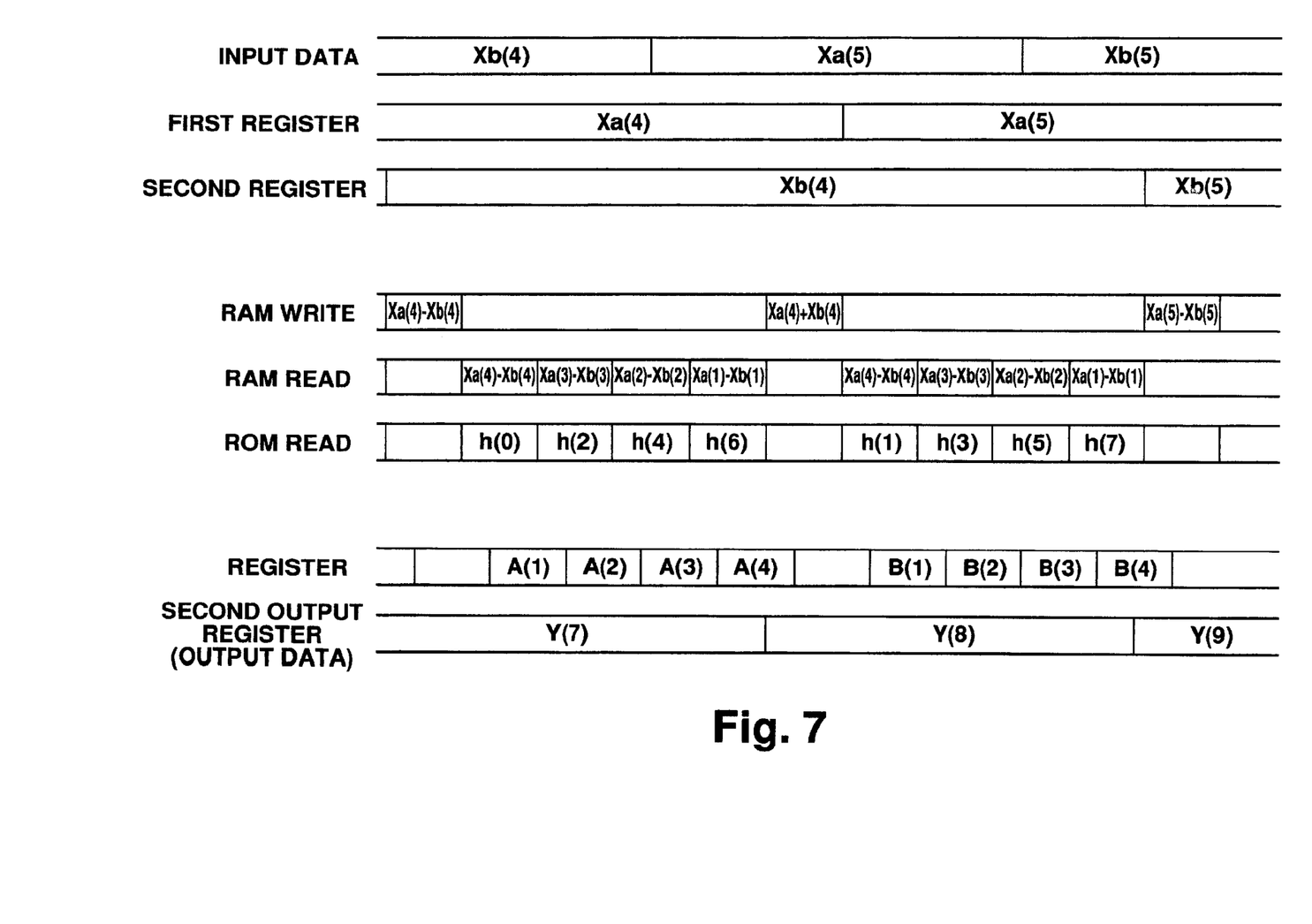
FIG. 7 is an internal data flow timing chart, intended to explain the data synthesizing operation executed by the digital filter of the first embodiment.

FIG. 7 shows an example internal data flow timing chart, in order to explain the synthesis filter operation of the digital filter configured as shown in FIG. 5, on the assumption that the number of taps N is "4," that is, n=4. In the synthesis filter mode, the first selector 47 selects the input data Xa(n) and Xb(n) and, the second selector 51 selects the adding/subtracting calculation data from the adder-subtracter 50, and the third selector 52 selects the accumulation data.

If equations (11) and (12) are recalculated assuming the number of taps N=4. The calculation for equation (11) will be as follows:

$$Y(2n)=h(0)\cdot\{Xa(n)-Xb(n)\}+h(2)\cdot\{Xa(n-1)-Xb(n-1)\}+h(4)\cdot\{Xa(n-2)-Xb(n-2)\}+h(6)\cdot\{Xa(n-3)-Xb(n-3)\} \quad (15)$$

The calculation for equation (12) will be as follows:

$$Y(2n+1)=h(1)\cdot\{Xa(n)-Xb(n)\}+h(3)\cdot\{Xa(n-1)-Xb(n-1)\}+h(5)\cdot\{Xa(n-2)-Xb(n-2)\}+h(7)\cdot\{Xa(n-3)-Xb(n-3)\} \quad (16)$$

Input data Xa(4) and Xb(4), which are alternately input to the digital filter on a time-sharing basis, are stored into the first register 48 and the second register 49, respectively, via the first selector 47. The adder-subtracter 50 subtracts the input data Xb(4) stored into the second register 49 from the input data Xa(4) stored into the first register 48. The subtracting calculation data {Xa(4)−Xb(4)} is written into the RAM 41 via the second selector 51. Although FIG. 7 omits the subtraction processing for input data Xa(1) to Xa(3) and Xb(1) to Xb(3), subtraction is executed in the same manner as for the input data Xa(4) and Xb(4). After the input data Xa(1) to Xa(3) and Xb(1) to Xb(3) are stored into the first register 48 and the second register 49 respectively, the adder-subtracter 50 subtracts Xb(l) from Xa(1), Xb(2) from Xa(2), and Xb(3) from Xa(3). Then, it is assumed that the subtracting calculation data {Xa(1)−Xb(l)}, {Xa(2)−Xb(2)}, and {Xa(3)−Xb(3)} have also been stored into the RAM 41.

When the subtracting calculation data {Xa(4)−Xb(4)} is first read from the RAM 41 and its corresponding filter coefficient h(0) is read from the ROM 42, the multiplier 43 multiplies the data {Xa(4)−Xb(4)} by the filter coefficient h(0) and the multiplication product data is supplied to the accumulator 44. At this time, the register 46 of the accumulator 44 has been cleared to zero. Thus, the following value, that is, the product of the above multiplication, is stored as is into the register 46:

$$A1=h(0)\cdot\{Xa(4)-Xb(4)\}$$

Then, the subtracting calculation data {Xa(3)−Xb(3)}, {Xa(2)−Xb(2)}, and {Xa(1)−Xb(1)} and their corresponding filter coefficients h(2), h(4), and h(6) are sequentially read from the RAM 41 and the ROM 42 respectively. The multiplier 43 multiplies {Xa(3)−Xb(3)} by h(2), {Xa(2)−Xb(2)} by h(4), {Xa(1)−Xb(1)} by h(6) and sequentially supplies each multiplication product data to the accumulator 44. Each multiplication product input is accumulated in the accumulator 44 and the following are sequentially stored into the register 46:

$$A2=h(2)\cdot\{Xa(3)-Xb(3)\}+A1$$

$$A3=h(4)\cdot\{Xa(2)-Xb(2)\}+A2$$

$$A4=h(6)\cdot\{Xa(1)-Xb(1)\}+A3$$

Eventually, the following data is stored into the register 46:

$$A4=h(0)\cdot\{Xa(4)-Xb(4)\}+h(2)\cdot\{Xa(3)-Xb(3)\}+h(4)\cdot\{Xa(2)-Xb(2)\}+h(6)\cdot\{Xa(1)-Xb(1)\}$$

This data is stored into the second output register 54 as output data Y(8).

Next, the adder-subtracter 50 adds the input data Xa (4) stored into the first register 48 and the input data Xb(4) stored into the second register 49 and the adding calculation data {Xa(4) +Xb(4)} is written into the RAM 41 via the second selector 51. Although FIG. 7 omits the addition processing for input data Xa(1) to Xa(3) and Xb(1) to Xb(3), addition is executed in the same manner as done for the input data Xa(4) and Xb(4). After the input data Xa(1) to Xa(3) and Xb(1) to Xb(3) are stored into the first register 48 and the second register 49 respectively, the adder-subtracter 50 adds Xa(1) and Xb(1), Xa(2) and Xb(2), and Xa(3) and Xb(3). Then, it is assumed that the adding calculation data {Xa(1)+Xb(1)}, {Xa(2)+Xb(2)}, and {Xa(3)+Xb(3)} have also been stored into the RAM 41.

When the adding calculation data {Xa(4)+Xb(4)} is read from the RAM 41 and its corresponding filter coefficient h(1) is read from the ROM 42, the multiplier 43 multiplies the data {Xa(4) +Xb(4)} by the filter coefficient h(1) and the multiplication product data is supplied to the accumulator 44. At this time, no data exists in the accumulator 44. Thus, the following data, that is, the product of the above multiplication, is stored as is into the register 46:

$$B1=h(1)\cdot\{Xa(4)+Xb(4)\}$$

Then, the adding calculation data {Xa(3)+Xb(3)}, {Xa(2)+Xb(2)}, and {Xa(1)+Xb(1)} and the filter coefficients h(3), h(5), and h(7) are sequentially read from the RAM 41 and the ROM 42 respectively. Each product obtained by multiplying {Xa(3)+Xb(3)} by h(3), {Xa(2)+Xb(2)} by h(5), {Xa(1)+Xb(1)} by h(7) is sequentially supplied to the accumulator 44. Thus, the following are sequentially stored into the register 46:

$$B2=h(3)\cdot\{Xa(3)+Xb(3)\}+B1$$

$$B3=h(5)\cdot\{Xa(2)+Xb(2)\}+B2$$

$$B4=h(7)\cdot\{Xa(1)+Xb(1)\}+B3$$

Eventually, the following data is stored into the register 46:

$$B4=h(1)\cdot\{Xa(4)+Xb(4)\}+h(3)\cdot\{Xa(3)+Xb(3)\}+h(5)\cdot\{Xa(2)+Xb(2)\}+h(7)\cdot\{Xa(1)+Xb(1)\}$$

This data is stored into the second output register 54 as output data Y(9). As a result, the arithmetic operations expressed by the above-mentioned equations (15) and (16) have now been accomplished.

Figure 8:
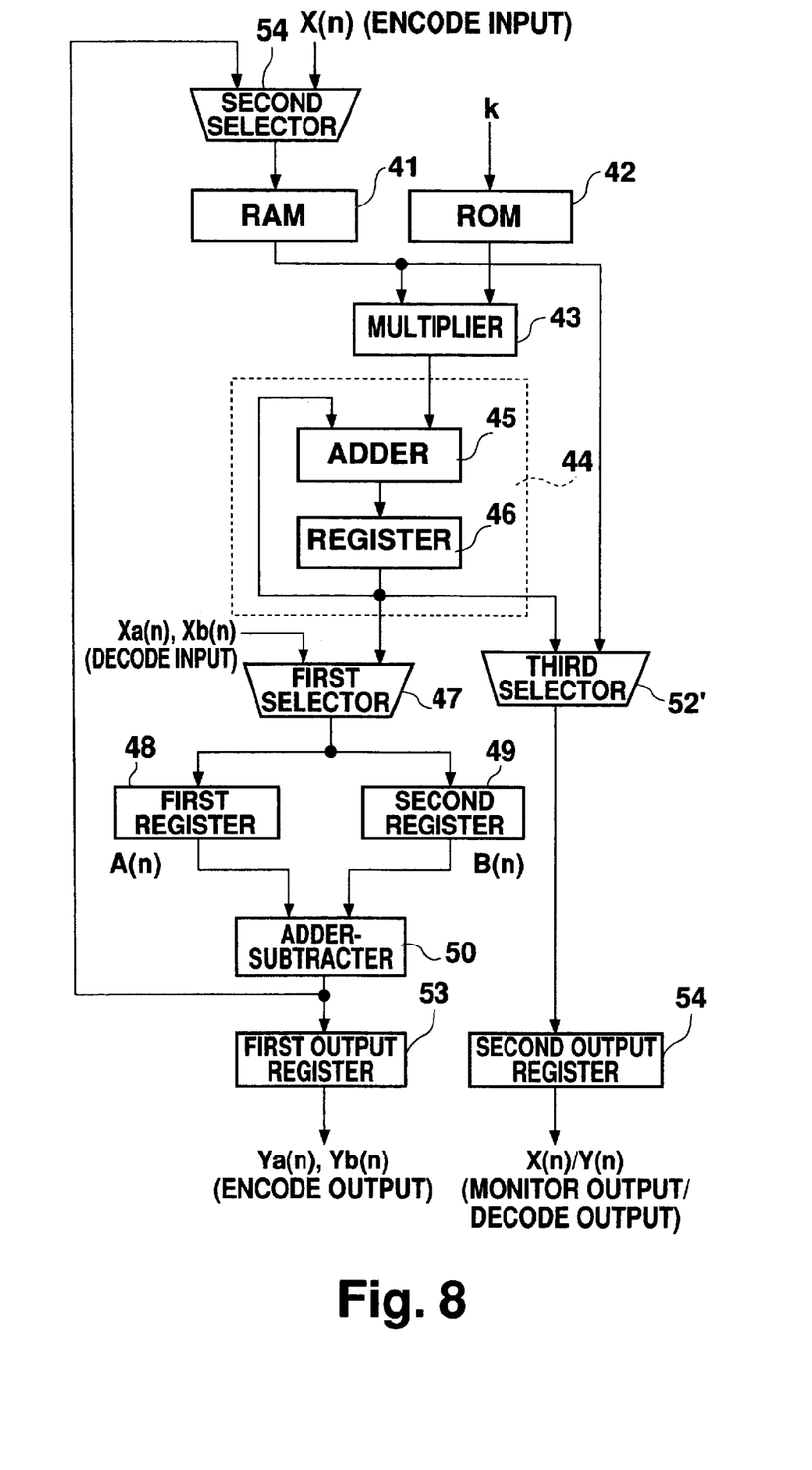
FIG. 8 is a block diagram showing a digital filter configured as in a second embodiment of the present invention.

FIG. 8 is a block diagram showing a digital filter configured in accordance with a second embodiment of the present invention.

In this digital filter embodiment, a third selector 52' is connected to the RAM 41 and the accumulator 44 in order to select and output either the data read from the RAM 41 or the accumulation data output from the accumulator 44. This digital filter circuit is designed such that input data X(n) read from the RAM 41 is directly delivered to the second output register 54 without the intervention of the multiplier 43 when the digital filter executes the separation of input data X(n). The selective action of the third selector 52' is the same as that of the third selector 52 shown in FIG. 5. With the exception of the third selector 52', the circuit structure and the operation of the second digital filter embodiment is the same as the first digital filter embodiment shown in FIG. 5, and its explanation will not be repeated.

In the digital filter configured as shown in FIG. 8, the number of multiplications to be executed by the multiplier 43 can be decreased by one because input data X(n) read from the RAM 41 is directly delivered to the second output register 54. However, the level of input data X(n) cannot be adjusted.

Although the above description refers to a case where the digital filter has four taps, providing the digital filter with five or more taps without changing its circuit structure is easy.

According to the present invention, a digital filter can be constructed with a multiplier, an accumulator, and an adder-subtracter that are commonly used to implement its separation and synthesis filter functions, using a QMF based on the stored program method, beneficial for reducing its overall circuit size. When the digital filter functions as the separation filter, the input data can be output, as is, to the outside. Therefore, the digital filter according to the invention has advantages including reduction of entire circuit size and extension of output data use range.

What is claimed is:

1. A digital filter for producing data through input data synthesis and input data separation, comprising:

a RAM for storing data to be processed;

a multiplier for multiplying said data to be processed after read from said RAM by a constant or a given filter coefficient;

an accumulator which sequentially accumulates the product of multiplying time series data by said filter coefficient, executed by said multiplier;

a first selector which selects and outputs either the sum of accumulation executed by said accumulator or first and second time-series input data;

first and second registers which alternately receive and store the data selected and output by said first selector;

an adder-subtracter for adding or subtracting calculation on two different data outputs from said first and second registers;

a second selector which selects either the result of arithmetic executed by said adder-subtracter or third time-series input data and supplies the selected one as said data to be processed to said RAM; and a third selector selects either the product of multiplying said data to be processed by said constant, executed by said multiplier, or the sum of accumulation executed by said accumulator, said digital filter in its first operation mode outputting the sum of accumulation executed by said accumulator as first time-series output data produced by the synthesis of said first and second time-series input data, and said digital filter in its second operation mode outputting the result of arithmetic executed by said adder-subtracter as second and third time-series output data produced by the separation of said third time-series input data as well as the product of multiplication executed by said multiplier as data for monitoring said third time-series input data.

2. The digital filter according to claim 1, wherein:

said first and second time-series input data are decode input data and said first time-series output data is decode output data; and said third time-series input data is encode input data and said second and third time-series output data are encode output data.

3. The digital filter according to claim 2, wherein said ROM stores a constant which is read and supplied to said multiplier at specific timing when said third time-series input data is read from said RAM.

4. The digital filter according to claim 1, further including:

a ROM for storing a plurality of filter coefficients, one filter coefficient being read from it and supplied to said multiplier each time said multiplier is executing its arithmetic operation.

5. The digital filter according to claim 1, further including:

a first output register which stores the result of arithmetic executed by said adder-subtracter as the second or third time-series output data; and a second output register which stores the sum of accumulation executed by said accumulator as the first time-series output data.

6. A digital filter for producing data through input data synthesis and input data separation, comprising:

a RAM for storing data to be processed;

a multiplier for multiplying said data to be processed after read from said RAM by a given filter coefficient;

an accumulator which sequentially accumulates the product of multiplication executed by said multiplier;

a first selector which selects and outputs either the sum of accumulation executed by said accumulator or first and second time-series input data;

first and second registers which alternately receive and store the data selected and output by said first selector;

an adder-subtracter for adding or subtracting calculation on two different data outputs from said first and second registers;

a second selector which selects either the result of arithmetic executed by said adder-subtracter or third time-series input data and supplies the selected one as said data to be processed to said RAM; and a third selector selects either said data to be processed or the result of arithmetic executed by said accumulator, said digital filter in its first operation mode outputting the sum of accumulation executed by said accumulator as first time-series output data produced by the synthesis of said first and second time-series input data, and said digital filter in its second operation mode outputting the result of arithmetic executed by said adder-subtracter as second and third time-series output data produced by the separation of said third time-series input data as well as said input data to be processed as data for monitoring said third time-series input data.

* * * * *

UNITED STATES PATENT AND TRADEMARK OFFICE
CERTIFICATE OF CORRECTION

PATENT NO. : 6,279,021 B1
DATED : August 21, 2001
INVENTOR(S) : Takano et al.

It is certified that error appears in the above-identified patent and that said Letters Patent is hereby corrected as shown below:

Title page,
Item [75], Inventors, after "Takano," delete "Ogaki; Fumiaki Nagao, Ibi-gun, both of (JP)" and insert therefor -- Fumiaki Nagao, both of Gifu (JP) --

Column 2,
Line 43, after "equation:" delete "$h_2(n)=(-1)^n-hl(n)$" and insert therefor
-- $h_2(n)=(-1)^n \cdot hl(n)$ --

Column 5,
Line 26, after "calculations" delete "aftermultiplication" and insert therefor -- after multiplication --

Column 8,
Line 62, in the equation, delete "+X(4)" and insert therefor -- ·X(4) --

Signed and Sealed this

Third Day of May, 2005

JON W. DUDAS
*Director of the United States Patent and Trademark Office*